United States Patent
Rzeszut et al.

(10) Patent No.: US 6,515,290 B1
(45) Date of Patent: Feb. 4, 2003

(54) BULK GAS DELIVERY SYSTEM FOR ION IMPLANTERS

(75) Inventors: Richard J. Rzeszut, Billerica, MA (US); James P. Quill, Wakefield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 256 days.

(21) Appl. No.: 09/654,958

(22) Filed: Sep. 5, 2000

(51) Int. Cl.[7] ........................... H01J 27/00; H01J 37/30
(52) U.S. Cl. ............... 250/492.21; 313/362.1; 250/423 R
(58) Field of Search ................ 250/423 R, 452.21; 313/362.1

(56) References Cited

U.S. PATENT DOCUMENTS

| | | | |
|---|---|---|---|
| 4,977,785 A | * 12/1990 | Willoughby et al. | 73/863.12 |
| 5,055,696 A | * 10/1991 | Haraichi et al. | 250/492.21 |
| 5,070,275 A | * 12/1991 | Ibuka et al. | 250/423 R |
| 5,935,305 A | 8/1999 | Tom et al. | |
| 6,052,057 A | 4/2000 | Yang et al. | |
| 6,406,519 B1 | * 6/2002 | Tom et al. | 95/95 |

FOREIGN PATENT DOCUMENTS

JP      11149881 A   * 6/1999

* cited by examiner

Primary Examiner—Bruce Anderson
(74) Attorney, Agent, or Firm—Eschweiler & Associates, LLC

(57) ABSTRACT

A gas delivery system for an ion implantation system comprises a gas source at a first voltage potential and an ion source at a second voltage potential which is larger than the first voltage potential. The system further comprises an electrically insulative connector coupled between the gas source and the ion source. The present invention also comprises a method of delivering gas to an ion implantation system which comprises maintaining a voltage potential of a source gas at a storage location at a first voltage potential that is less than a second voltage potential at an ion source of the ion implantation system and delivering the source gas from the storage location to the ion source.

21 Claims, 7 Drawing Sheets

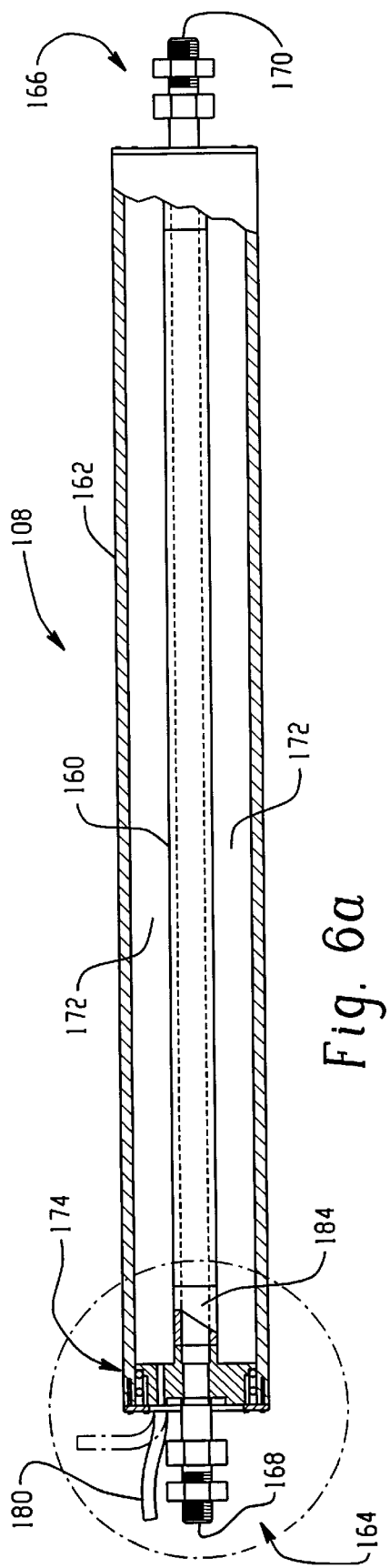
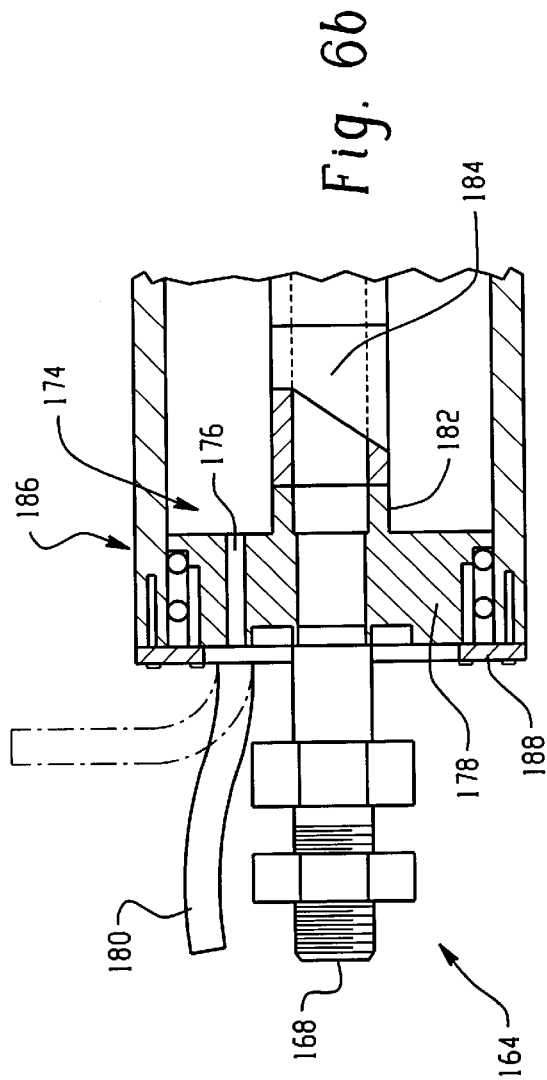
Fig. 6a
Fig. 6b

BULK GAS DELIVERY SYSTEM FOR ION IMPLANTERS

FIELD OF THE INVENTION

The present invention relates generally to ion implantation systems, and more specifically to a gas delivery system and method for supplying gas across a voltage gap in an ion implantation system or other type equipment.

BACKGROUND OF THE INVENTION

Ion implanters are used to implant or "dope" silicon wafers with impurities to produce n or p type extrinsic materials. The n and p type extrinsic materials are utilized in the production of semiconductor integrated circuits. As its name implies, the ion implanter dopes the silicon wafers with a selected ion species to produce the desired extrinsic material. Implanting ions generated from source materials such as antimony, arsenic or phosphorus results in n type extrinsic material wafers. If p type extrinsic material wafers are desired, ions generated with source materials such as boron, gallium or indium will be implanted.

The ion implanter includes an ion source for generating positively charged ions from ionizable source materials. The generated ions are formed into a beam and accelerated along a predetermined beam path to an implantation station. The ion implanter includes beam forming and shaping structure extending between the ion source and the implantation station. The beam forming and shaping structure maintains the ion beam and bounds an elongated interior cavity or region through which the beam passes en route to the implantation station. When operating the implanter, the interior region must be evacuated to reduce the probability of ions being deflected from the predetermined beam path as a result of collisions with air molecules.

For high current ion implanters, the wafers at the implantation station are mounted on a surface of a rotating support. As the support rotates, the wafers pass through the ion beam. Ions traveling along the beam path collide with and are implanted in the rotating wafers. A robotic arm withdraws wafers to be treated from a wafer cassette and positions the wafers on the wafer support surface. After treatment, the robotic arm removes the wafers from the wafer support surface and redeposits the treated wafers in the wafer cassette.

FIG. 1 depicts an exemplary ion implanter, shown generally at 10, which includes an ion source 12 for emitting ions that form an ion beam 14 and an implantation station 16. Control electronics 11 are provided for monitoring and controlling the ion dosage received by the wafers within a process chamber 17 at the implantation station 16. The ion beam 14 traverses the distance between the ion source 12 and the implantation station 16.

The ion source 12 includes a plasma chamber 18 defining an interior region into which source materials are injected. The source materials may include an ionizable gas or vaporized source material. Source material in solid form may be deposited into a pair of vaporizers 19. Alternatively, gas sources stored either in high pressure or low pressure type containers may be used. The gaseous hydrides arsine ($AsH_3$) and phosphine ($PH_3$) are used commonly as sources of arsenic (As) and phosphorous (P) in ion implantation. Due to their toxicity, such gaseous sources are often maintained local to the ion source 12 in low pressure SDS (safe delivery system) bottles.

The source material is injected into the plasma chamber and energy is applied to the source materials to generate charged ions in the plasma chamber 18. The charged ions exit the plasma chamber interior through an elliptical arc slit in a cover plate 20 overlying an open side of the plasma chamber 18.

The ion beam 14 travels through an evacuated path from the ion source 12 to the implantation station 17, which is also evacuated via, for example, vacuum pumps 21. Ions in the plasma chamber 18 are extracted through the arc slit in the plasma chamber cover plate 20 and are accelerated toward a mass analyzing magnet 22 by a set of electrodes 24 adjacent the plasma chamber cover plate 20. Ions that make up the ion beam 14 move from the ion source 12 into a magnetic field set up by the mass analyzing magnet 22. The mass analyzing magnet is part of the ion beam forming and shaping structure 13 and is supported within a magnet housing 32. The strength of the magnetic field is controlled by the control electronics 11 by adjusting a current through the magnet's field windings. The mass analyzing magnet 22 causes the ions traveling along the ion beam 14 to move in a curved trajectory. Only those ions having an appropriate atomic mass reach the ion implantation station 16. Along the ion beam travel path from the mass analyzing magnet 22 to the implantation station 16, the ion beam 14 is further shaped, evaluated and accelerated due to the potential drop from the high voltage of the mass analyzing magnet housing 32 to the grounded implantation chamber.

The ion beam forming and shaping structure 13 further includes a quadrupole assembly 40, a moveable Faraday cup 42 and an ion beam neutralization apparatus 44. The quadrupole assembly 40 includes set of magnets 46 oriented around the ion beam 14 which are selectively energized by the control electronics (not shown) to adjust the height of the ion beam 14. The quadrupole assembly 40 is supported within a housing 50.

Coupled to an end of the quadrupole assembly 40 facing the Faraday flag 42 is an ion beam resolving plate 52. The resolving plate 52 includes an elongated aperture 56 through which the ions in the ion beam 14 pass as they exit the quadrupole assembly 40. The resolving plate 52 also includes four counterbored holes 58. Screws (not shown) fasten the resolving plate 52 to the quadrupole assembly 40. At the resolving plate 52 the ion beam dispersion, as defined by the width of the envelope D', D", is at its minimum value, that is, the width of D', D" is at a minimum where the ion beam 14 passes through the resolving plate aperture 56.

The resolving plate 52 functions in conjunction with the mass analyzing magnet 22 to eliminate undesirable ion species from the ion beam 14. The quadrupole assembly 40 is supported by a support bracket 60 and a support plate 62. The support bracket 60 is coupled to an interior surface of the resolving housing 50.

As stated supra, ion source materials are provided to the ion source 12 in a variety of different ways. Because switching solid source materials is a relatively time-consuming process, use of gaseous source materials is often utilized. Since some of the gaseous ion source materials are toxic, SDS bottles are often utilized which are not pressurized to enhance safety in the event of leakage. Such containers typically are stored in a gas box which is local to or integrated into the ion implanter. Consequently, replacement of the SDS bottles for purposes of ion source material replenishment requires entry into the clean room in which the ion implanter resides, which contributes to machine down time and potential particulate contamination. Therefore it would be desirable to further improve upon present ion source delivery systems.

SUMMARY OF THE INVENTION

The present invention is directed to a gas delivery system for an ion implanter in which a gaseous ion source material is electrically isolated and/or located remote from the ion implanter. The ion source material may reside at a location remote from the ion implanter such as a centralized gas bunker and is maintained at a first voltage potential such as a ground potential. The gaseous ion source material is then delivered to the ion source of the ion implanter which resides at a second potential via a gas delivery network and is coupled to the implanter via an electrically insulative connector. The connector serves as a voltage isolator between the gas storage and/or delivery network provided at the first voltage potential and the ion source of the ion implanter which operates at the second potential.

The gas delivery system of the present invention provide various advantages over prior art gas delivery systems. For example, because the gaseous ion source is stored and transferred from a remote location, for example, in the gas bunker, the downtime associated with ion source material changes is reduced substantially. Further because ion source material replacements may be effectuated remote from the implanter, the potential particulate contamination due to handling gas bottles in the clean room is eliminated. In addition, since the gas box which is local to the ion implanter no longer holds individual gas bottles (e.g., SDS bottles), the size of the gas box may be reduced significantly.

According to one aspect of the present invention, a gas delivery system is disclosed which comprises a gas source at a first voltage potential and an ion source at a second voltage potential which is greater than the first potential. The gas delivery system further comprises an electrically insulative connector coupled between the gas source and the ion source which facilitates a fluid connection between the gas source and the ion source and electrically isolates the first potential from the second potential.

According to another aspect of the present invention, a gas delivery high voltage isolator structure is disclosed. The isolator structure comprises a first electrically insulative tube surrounded by a second electrically insulative tube in telescope arrangement. The isolator structure is terminated at each end with an adapter, for example, a stainless steel adapter and coupled, for example, by welding, to a VCR-type fitting. The first tube carries the gaseous ion source material at a first pressure and a spacing between the first and second tube carries an inert barrier gas at a second pressure which is different (e.g., higher) than the first pressure. The isolator structure may further include a monitoring port associated therewith, wherein the second pressure may be monitored and used to identify leakage associated with the isolator structure. The isolator structure may further exhibit a length sufficient to prevent arcing between each end, wherein the ends exhibit a potential difference thereacross.

According to yet another aspect of the present invention, a method of delivering gas to an ion implantation system is disclosed. The method comprises maintaining a source gas at a storage location at a first voltage potential which is less than a second voltage potential at the ion source of the ion implantation system. The method further comprises delivering the source from the storage location to the ion source. The delivery is accomplished, for example, by coupling a high voltage isolator structure between a bulk gas delivery system and the ion source. The bulk gas delivery system is maintained at the first potential, for example, circuit ground while the ion source is maintained at the second voltage potential, for example, 80 KV. The isolator structure allows for the storage and replacement of ion source materials remote from the implantation system, thereby facilitating easy replacement and changeover of ion source material.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 6a is a cross section diagram illustrating a high voltage isolator structure in accordance with one aspect of the present invention;

FIG. 6b is an exploded cross section diagram illustrating a termination portion of the high voltage isolator structure of FIG. 6a in accordance with one aspect of the present invention;

DETAILED DESCRIPTION OF THE INVENTION

Figure 1:
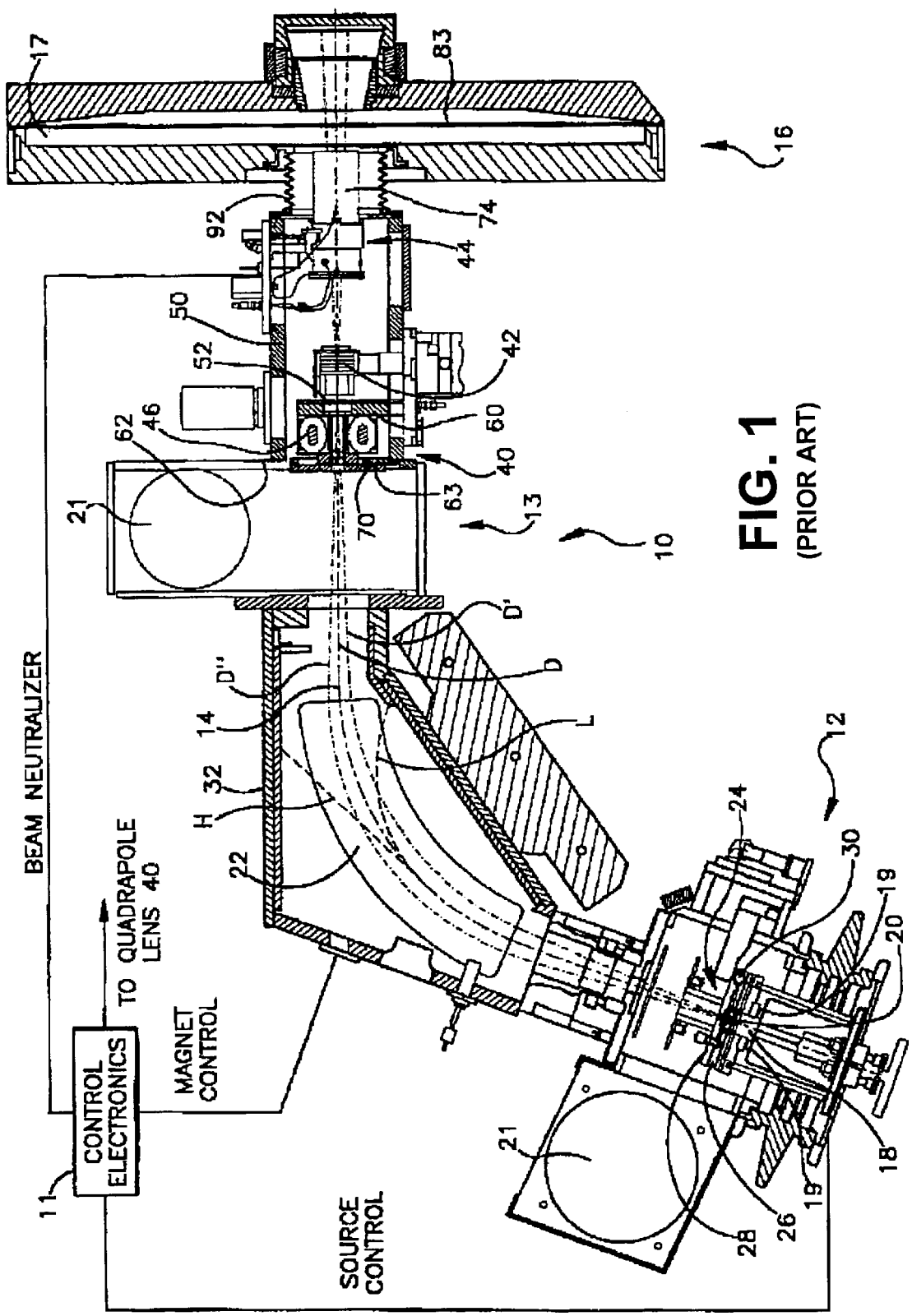
FIG. 1 is a prior art system level diagram of an ion implantation system.

The present invention will now be described with reference to the drawings wherein like reference numerals are used to refer to like elements throughout. The present invention includes a system and method of delivering an ion source gas from a storage location to the ion source of an ion implantation system when the storage location and the ion source reside at differing voltage potentials. The system of the present invention comprises an ion gas source, for example, pressurized gas within gas cannisters maintained in a storage location which is remote from the ion implantation system, for example, a centralized gas bunker. The ion gas source is maintained at the storage location at a first voltage potential, for example, circuit ground potential.

The ion source gas is then transferred to the ion implantation system via a bulk gas distribution network in a manner similar to gas transfers to other types of processing equipment. Once the ion source gas is local to the ion implantation system, which resides at a second voltage potential (e.g., about 80 KV or more), the gas is coupled to the gas box of the ion implantation system via one or more high voltage isolator structures which permit the ion source gas to be stepped up from the first voltage potential to the second voltage potential, respectively. The ion source gas is then provided to the ion implanter at the second voltage potential as needed. The system and method of the present invention allows for remote storage of the ion source gas at a voltage potential which differs from the voltage potential at the ion implantation system, thereby facilitating the easy storage, replenishment and replacement of ion source gas materials.

Figure 2:
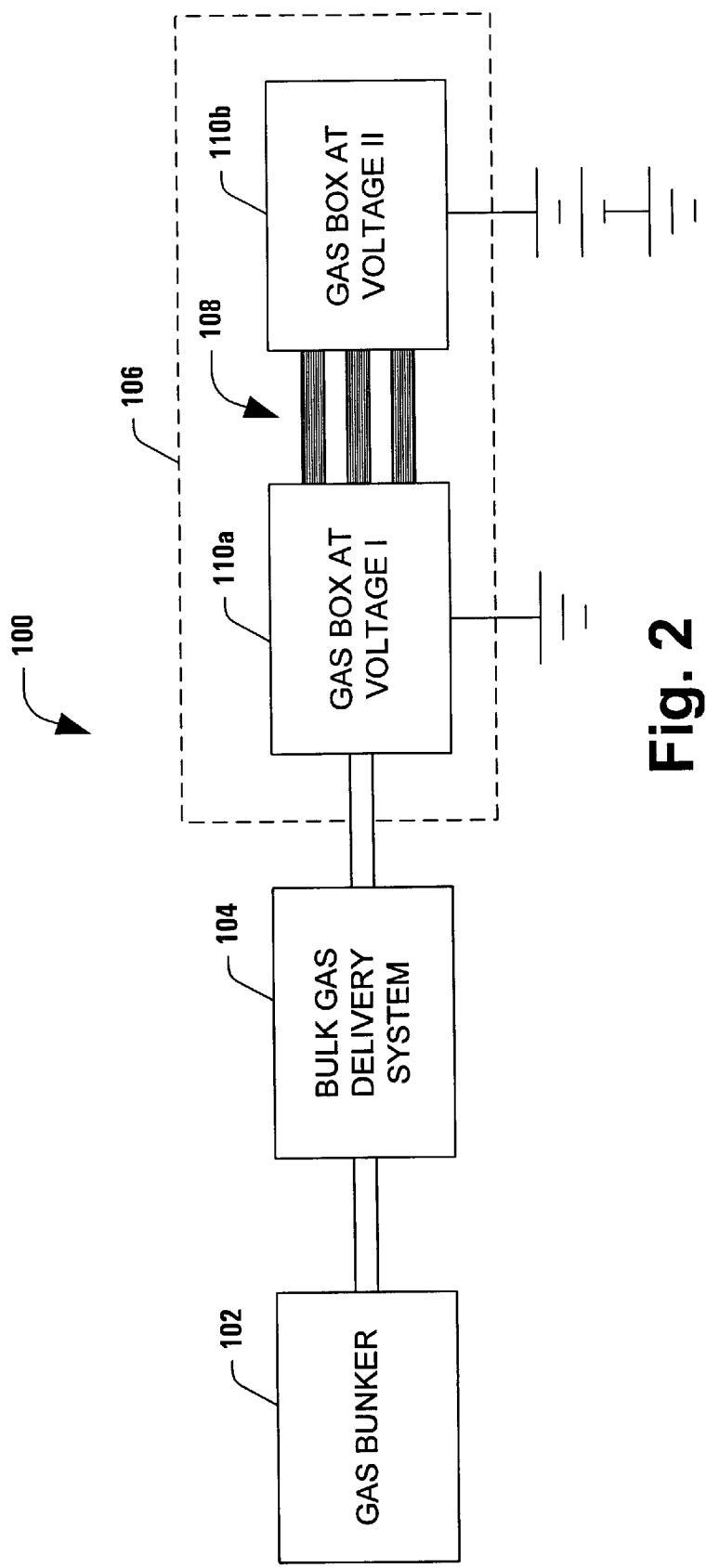
FIG. 2 is a block diagram illustrating an ion source material delivery system according to one exemplary aspect of the present invention.

Turning now to the figures, FIG. 2 is a block level diagram illustrating an ion source material delivery system 100 in accordance with an exemplary aspect of the present invention. The delivery system 100 includes a gas bunker 102 located remote from the ion implantation system, for example, outside the clean room in which the ion implantation equipment resides. According to one aspect of the present invention, the gas bunker 102 is a centralized gas storage location within the fabrication facility which holds the various process gases needed for the diverse processing steps therein. The gas bunker 102 includes storage space for multiple cannisters and different process gases which may be contained in various types of containers, such as pressurized cannisters as opposed to being stored solely in SDS type bottles. Consequently, replacing an empty gas cannister can be performed simply by fluidly isolating the cannister and switching in a new one without interrupting the delivery of gas. According to one exemplary aspect of the present invention, the process gas in the gas bunker 102 is maintained at a first voltage potential such as circuit ground potential.

The delivery system 100 further includes a bulk gas delivery system 104 operatively coupled to the gas bunker 102 for transferring process gas from the bunker 102 to the various different pieces of processing equipment, for example, an ion implantation system. For example, the bulk gas delivery system 104 may include a plurality of gas lines with associated valves, gauges, etc. to distribute the process gases from the gas bunker 102 to the processing equipment. For example, the bulk gas delivery system 104 is operable to deliver multiple, differing types of ion source gases from the gas bunker 102 to the ion implantation equipment in a parallel type fashion to allow the differing source gases to reside thereat to facilitate an easy change over of ion source gases (e.g., to allow a change over from an "n" type dopant to a "p" type dopant). The valves, gauges, etc. of the bulk gas delivery system 104 may be utilized to fluidly isolate regions of the gas delivery system, monitor gas lines for leakage, purge gas lines, etc. According to one exemplary aspect of the present invention, the gas lines associated with the bulk gas delivery system 104 are electrically insulative and operate to maintain the gas delivery therethrough at the first voltage potential associated with the gas bunker 102.

The ion source gas is transferred via the bulk gas delivery system 104 to an exhausted enclosure 106 which is local to and associated with an ion implantation machine (not shown) which is sometimes referred to as the ion implanter gas box. Within the enclosure or gas box 106 the ion source gas is stepped up from the first voltage potential, for example, circuit ground potential, to a second potential at which the ion implanter operates (e.g., about 80 KV) via a gas delivery high voltage isolator structure 108. As illustrated in FIG. 2, one or more isolators 108 may be implemented in order to couple various different types of ion source gases to the ion implanter. Therefore the high voltage isolator structure 108 couples a low voltage portion 110*a* of the gas box to a high voltage portion 110*b* in a safe and reliable manner.

The high voltage isolator structure 108 allows for ion source process gases to be stored and maintained at a convenient voltage potential such as circuit ground and also allows such gases to be stored conveniently, for example, at high pressures which thereby decreases the cost of the ion source gases.

Although FIG. 2 illustrates the high voltage isolator 108 coupled between two gas boxes residing at differing potentials, other system configurations may also be employed and are contemplated as falling within the scope of the present invention. For example, a single gas box residing at a high voltage associated with the ion implanter may exist, and the isolator structure 108 may couple the gas at a low voltage from the bulk gas delivery system 104 to the high voltage gas box. Alternatively, a single gas box may reside at a low voltage such as circuit ground and the isolator structure 108 may couple the gas from the gas box at a low voltage to the ion source which resides at a high voltage.

Figure 3:
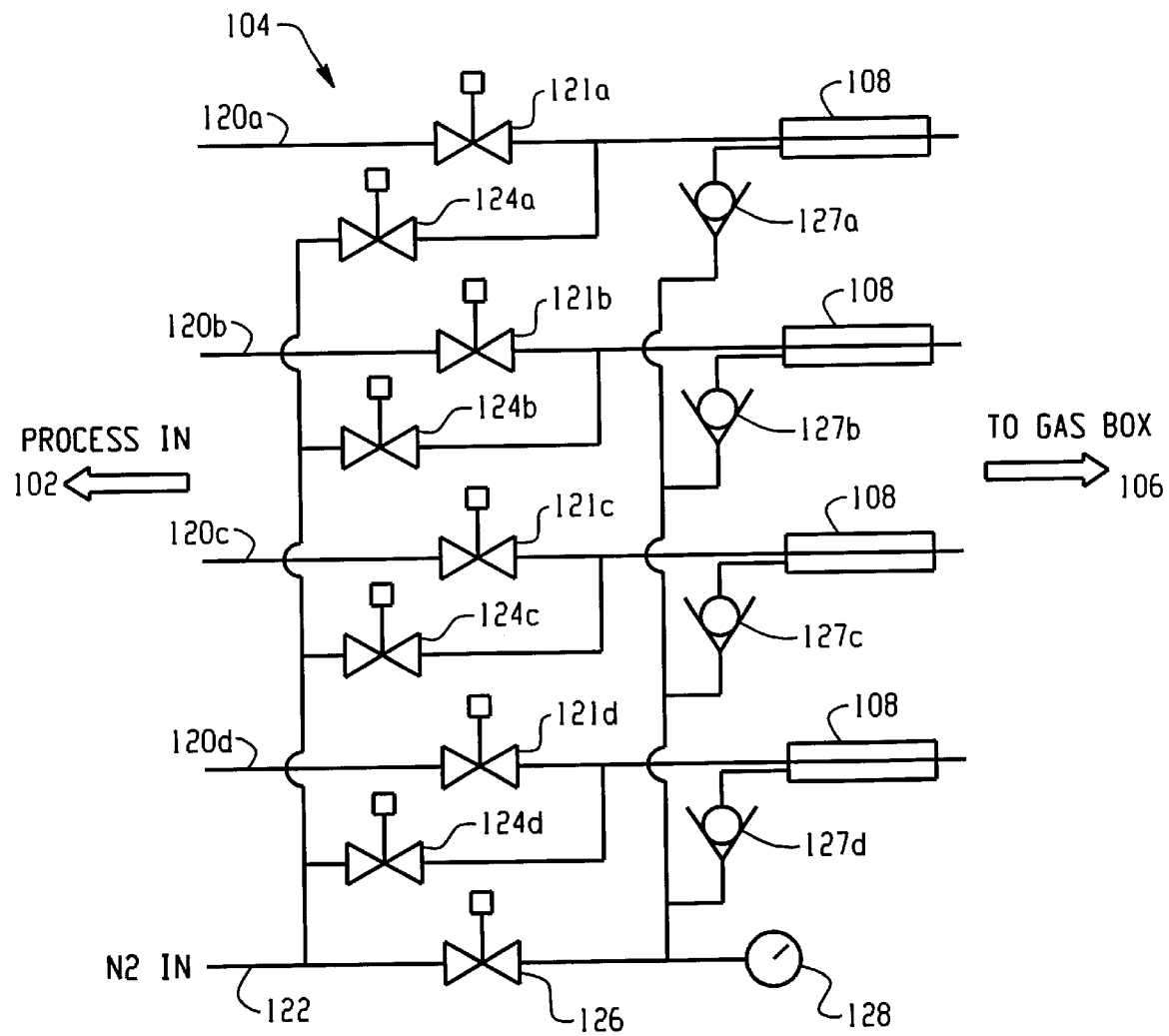
FIG. 3 is a schematic diagram illustrating a portion of an ion source gas delivery module maintained at a first voltage potential in accordance with one aspect of the present invention.

FIG. 3 is an exemplary schematic diagram of a portion of a bulk gas delivery system 104 for use in the system 100 of FIG. 2. The bulk gas delivery system 104 of FIG. 3 illustrates a system which provides for the delivery of four (4) different types of ion source gas, however, systems providing for more or fewer ion source gases may also be used and are contemplated as falling within the scope of the present invention. The delivery system 104 includes a set of ion source gas input lines 120*a*–120*d* which carry ion source gas from the gas bunker 102 to a region within the fabrication facility associated with an ion implantation system. Note that the system 104 of FIG. 3 illustrates a distribution to only one ion implantation system, however, delivery to multiple ion implantation systems may also be employed and is contemplated as falling within the scope of the present invention.

Another gas input line 122 is also provided in the delivery system 104 carrying an inert gas, for example, nitrogen to the various lines 120*a*–120*d* through a series of valves 124*a*–124*d*, respectively. The inert gas line 122 also couples to each of the high voltage isolators 108 via an isolator check valve 126 and a check valve 127*a*–127*d*. In addition, the inert gas line 122 has a pressure gauge 128 or other type monitoring device associated therewith that may be utilized to monitor for leaks associated with the high voltage isolators 108 as will be discussed in greater detail below.

Figure 4:
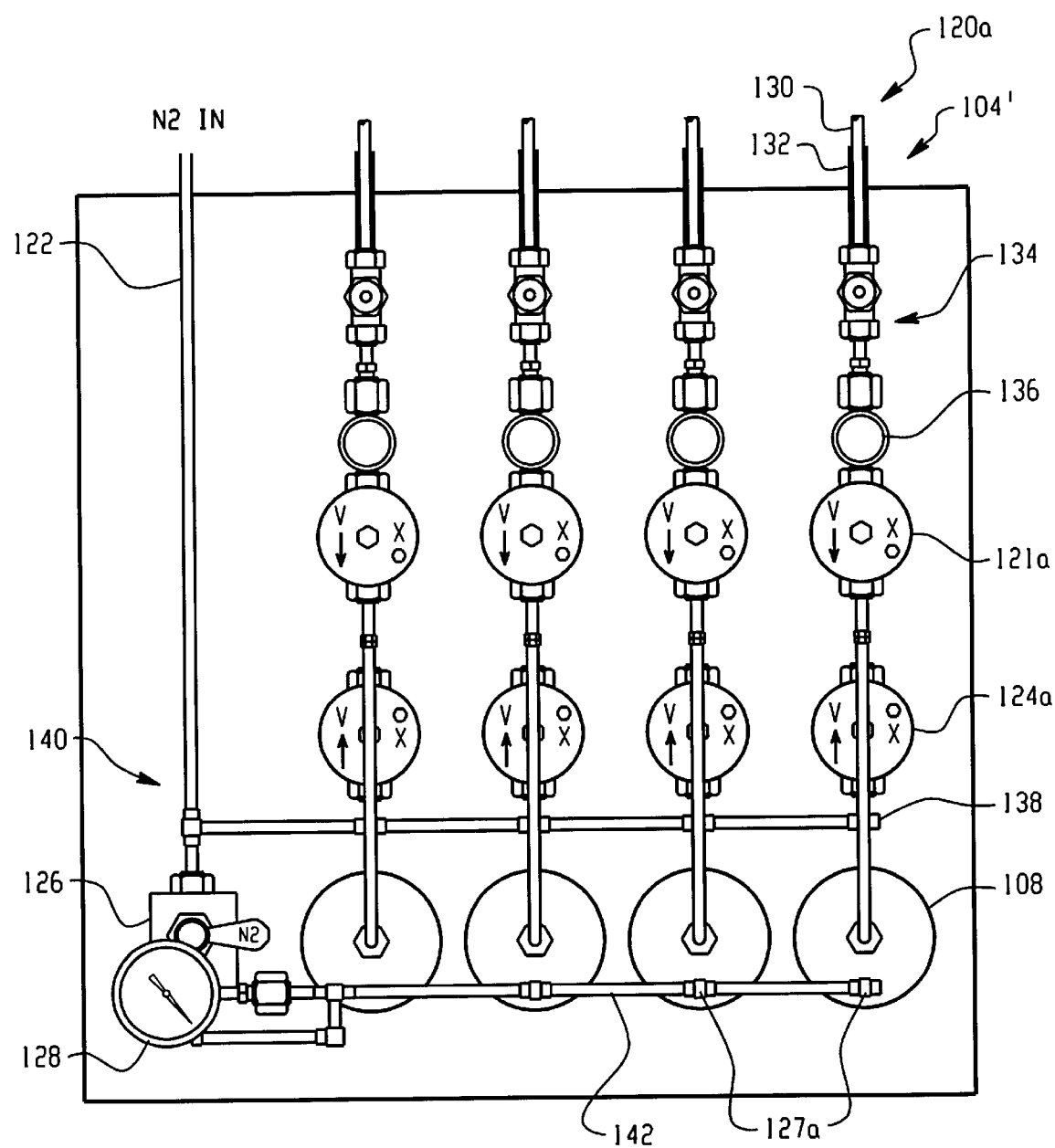
FIG. 4 is a schematic diagram illustrating the ion source gas delivery module portion of FIG. 3 in accordance with one aspect of the present invention.

An exemplary, more detailed ion source gas delivery system portion 104' is illustrated in FIG. 4. Because each of the four lines 120*a*–120*d* operate in a similar manner, only one of the lines will be discussed for purposes of simplicity and brevity. The ion source gas line 120*a* comprises an inner gas line 130 surrounded by an outer containment tube 132 which is provided for safety containment in the event the inner gas line 130 experiences leakage. In the above manner, any potentially toxic or corrosive ion source gases are safely contained and the inner gas line 130 is structurally protected. Alternatively, multiple inner gas lines may reside within a single containment tube, as may be desired. The ion source gas line 120*a* attaches to a coupling arrangement 134 to which a pressure switch 136 is coupled for monitoring/controlling the ion source gas pressure. The gas line 120*a* also includes the valve 121a, for example, an air OP-type valve which allows for a selective fluid connection of the ion source gas to the respective high voltage isolator structure 108 via a connecting tube 138.

An inert gas such as nitrogen is fed through the inert gas line 122 and is to distributed through a T-arrangement 140. The inert gas may be selectively coupled to the connecting tube 138 of FIG. 4 through the valve 124a. A manual shutoff valve 126 also couples to the inert gas line 122 to selectively couple the inert gas to an outside portion of a high voltage isolator 108 via a connecting tube 142 and the check valve 127a.

The coupling arrangement may be operated in the following exemplary fashion. When an ion source gas is being transferred to the ion implanter, the valve 121a is open thereby placing the ion source gas in fluid communication with the high voltage isolator structure 108. At this time, the inert gas supply valve 124a associated with line 120a is closed, thereby preventing the inert gas from diluting the ion source gas. The manual valve 126, however, has previously been opened, allowing the inert gas to enter the high voltage isolator structure 108, for example, in an outer tube thereof. Therefore the ion source gas residing in an inner tube of the structure 108 is surrounded by inert gas in an outer tube via the previously opened valve 126. Preferably, the inert gas pressure is greater than the ion source gas pressure so that any leakage associated with the inner tube of the structure 108 will cause the inert gas to leak onto the inner tube, thus avoiding leakage of the potentially caustic ion source gas from exiting the inner tube. Furthermore, any such leakage may be monitored via the pressure gauge 128, a pressure transducer or other type analytical monitoring tool. If the inert gas pressure in the line 142 changes (e.g., decreases), then inert gas is leaking into or out of the inner tube of the high voltage isolator structure 108. The inert gas pressure may be monitored via the gauge 128 and a microcontroller (not shown), as may be desired to aid in monitoring and controlling the operation of the various valves. For example, the microcontroller may close valves 121a–121d and open valves 124a–124d if a drop in pressure is detected (indicating a breach in the inner containment tube 150, FIG. 5) via the pressure gauge 128, thus eliminating source gas and diluting with inert gas.

The inert gas line 122 may also be utilized to purge the ion source gas lines, as may be desired. In such an instance, the ion source gas line valves 121a–121d are closed and the inert gas line valves 124a–124d are opened. The inert gas is then allowed to flow through lines 138 into an inner tube region of the high voltage isolator structure 108 and thus flush out the ion source gas lines on the ion implanter side. Alternatively, or in addition, another set of ion source gas line valves (not shown) may be closed and the inert gas may flow through lines 120a–120d back to the gas bunker 102. In any event, the gas delivery system 104, 104' of FIGS. 3 and 4 provides the ion source gas to the high voltage isolator structure 108 at a first voltage potential which may be equal to the potential at which the ion source gas is stored in the gas bunker 102.

Figure 5:
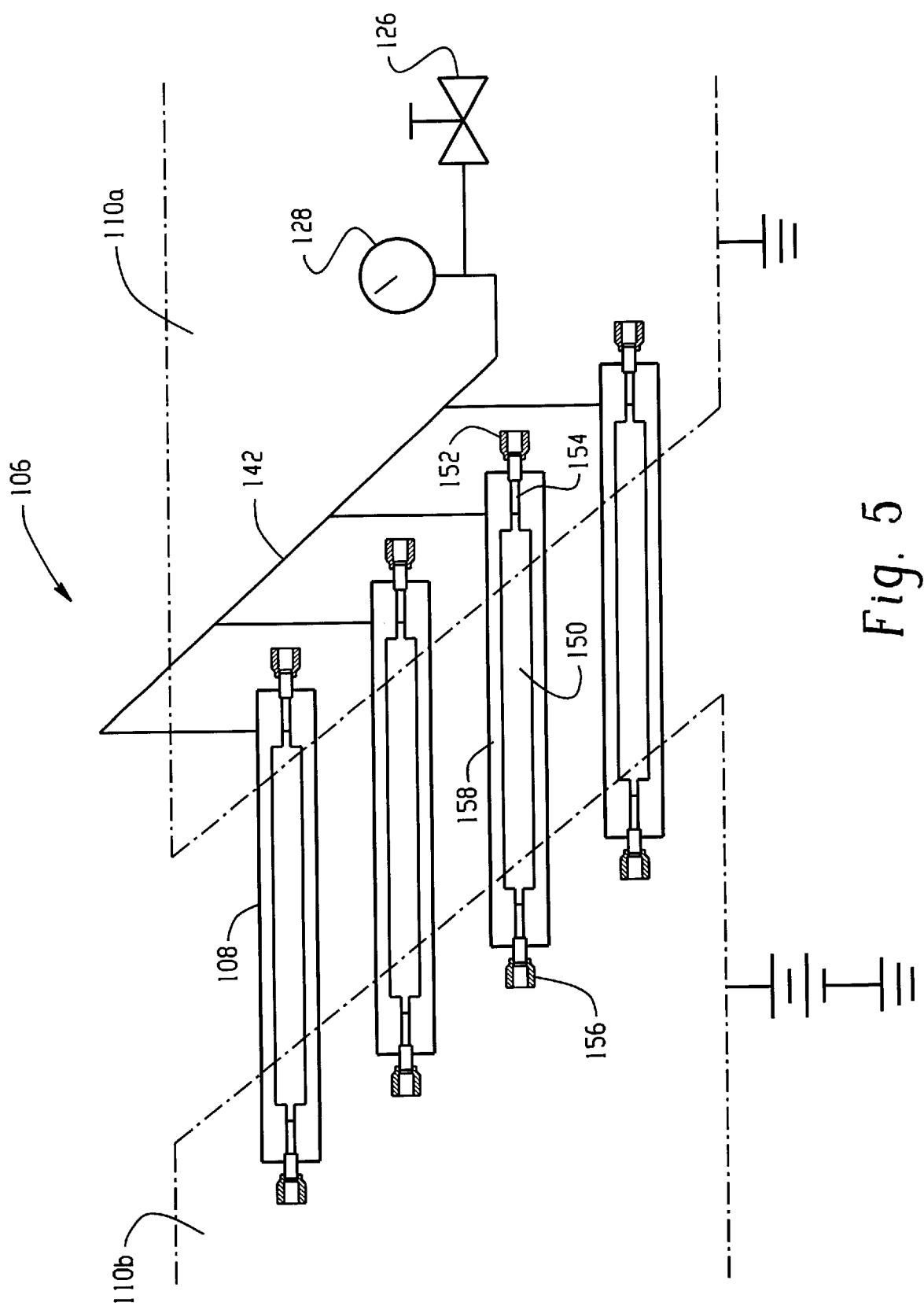
FIG. 5 is a combined perspective and schematic diagram illustrating a plurality of high voltage isolator structures coupled between the two exhausted enclosures which are maintained at different voltage potentials in accordance with one aspect of the present invention.

FIG. 5 is a perspective view illustrating the gas box 106 of FIG. 2 in greater detail. In particular, FIG. 5 illustrates a manner in which one or more high voltage isolator structures 108 may be used to couple ion source gases from the first portion 110a of the gas box residing at a first voltage potential (e.g., circuit ground) to the second portion 110b of the gas box residing at the second voltage potential (e.g., the operating potential of the ion implanter). As illustrated in FIG. 5, a portion of the gas delivery system 104 enters the first portion 110a of the gas box 106. The ion source gas enters an inner tube 150 of the high voltage isolator via a coupling 152, for example a VCR-type fitting. The coupling 152 connects to the inner tube 150 via a metal/insulator transition 154. The inner tube 150 is formed of an insulating material, for example, glass, ceramic, quartz, glass/ceramic or other dielectric material, to aid in isolating the first voltage potential at one end (first portion 110a) from the second potential at the other end (second portion 110b).

The high voltage isolator 108 also has a coupling 156 on the other end thereof which allows connection to the ion implanter. An outer tube 158 surrounds the inner tube 150 of the high voltage isolator 108 and is fluidly coupled to the inert gas line 142 which flows an inert gas having a predetermined pressure therein. As discussed supra, the inert gas is used to mitigate the negative impacts of a leak in the inner tube 150 and the pressure gauge 128 or other monitoring device facilitates an easy monitoring for any such leakage.

FIG. 6a illustrates a section view of the high voltage isolator structure 108 according to one exemplary aspect of the present invention. As discussed briefly supra, the high voltage isolator 108 may comprise an elongate, generally cylindrical tube having a generally cylindrical inner tube portion 160 (corresponding to tube 150 of FIG. 5) surrounded by a generally cylindrical outer tube portion 162 (corresponding to tube 158 of FIG. 5). The inner tube portion 160 carries the ion source gas therethrough from a first end 164 to a second end 166 thereof. In particular, the first end 164 terminates in a coupling 168 such as a VCR-type fitting and couples the high voltage isolator 108 to the gas delivery system 104 at the low voltage portion 110a of the gas box 106. Further, the second end 166 terminates in a coupling 170 such as a VCR-type fitting and couples the isolator 108 to the ion implanter via the high voltage portion 110b of the gas box 106.

The inner tube 160 is composed of an electrically insulating material, for example, a borosilicate glass. Alternatively, however, other electrically insulating materials may be employed and are contemplated as falling within the scope of the present invention. For example, other exemplary materials may include, but are not limited to an alumino-silicate glass, ceramic materials, etc (e.g., trade names such as Pyrex, Duran, Corning 7740, etc.). The outer tube 162 surrounds the inner tube 160 in a telescope arrangement and has a diameter larger than the inner tube 160, thereby defining a spacing 172 therebetween. The spacing 172 allows for an inert gas to flow within the outer tube 162 and outside the inner tube 160 and, when maintained at a pressure different (e.g., larger) than a pressure associated with the ion source gas in the inner tube 160, operates to prevent leakage of ion source gas out of the inner tube 160. The outer tube 162 is also composed of an electrically insulating material, for example, polypropylene, teflon, etc.

The high voltage isolator 108 of FIG. 6a also includes a port 174 associated with the outer tube 162 which allows an inert gas, for example, nitrogen to be pumped into the spacing 172 via, for example, the gas line 142 of FIG. 5. One exemplary port configuration is illustrated in greater detail in FIG. 6b, which represents an exemplary cross section of the end 164. The port 174 includes a cavity 176 defined by a hole in an end cap 178. The cavity 176 mates with a tube 180, for example, a flexible tube which couples to the inert gas line 142.

The spacing 172 between the inner tube 160 and the outer tube 162 is sealed via the end cap 178. The end cap 178 has an inner bore 182 associated therewith which surrounds or engages a glass-to-metal transition piece 184 associated with the inner tube 160 and receives the coupling therethrough. The end cap arrangement 178 also includes one or more O-rings 186 that operate to engage the outer tube 162, the end cap 178 and a cover 188 that attaches thereto to provide a fluidic seal to prohibit leakage associated with the high voltage isolator 108. Alternatively, such pieces may be welded together.

The high voltage isolator 108 operates to facilitate a step-up in voltage for the ion source gas from a first potential to a second potential. For example, the ion source gas may be stored in the gas bunker 102 at a circuit ground potential and transferred to the first portion 110a of the gas box 106 of the ion implanter at the storage potential (e.g., the first potential). Since the ion implanter operates at a higher voltage (e.g., about 80 KV), the high voltage isolator 108 provides a structure by which the ion source gas can be safely and reliably stepped up to an operating voltage (e.g., the second potential) of the ion implanter. According to one exemplary aspect of the present invention the high voltage isolator 108 has a length which is sufficiently long to withstand a potential difference across its ends 164, 166 without arcing thereacross. A general rule of thumb is to allow about 1 inch of length per about 10 KV of potential difference. Therefore if about a 80 KV potential difference exists between the ends 164, 166, a length of about 8 inches or more would be desirable. Any length that would prevent arcing, however, may be utilized and is contemplated as falling within the scope of the present invention.

Figures 7, 8:
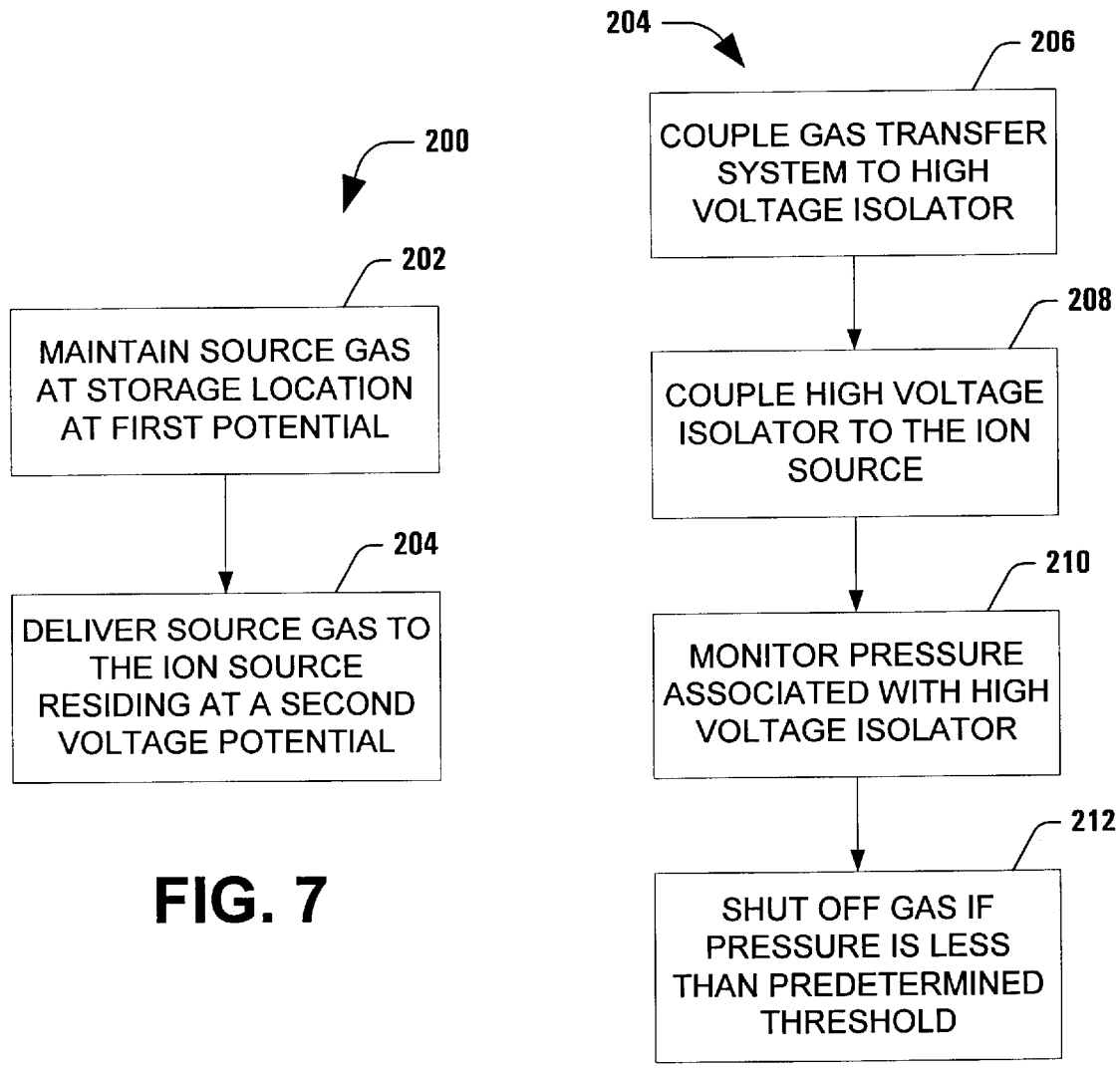
FIG. 7 is a flow chart diagram illustrating a method of delivering an ion source material to an ion implantation system in accordance with one aspect of the present invention.
FIG. 8 is another flow chart diagram illustrating a method of delivering an ion source gas from a storage location to the ion source when the storage location and the ion source location are maintained at different voltage levels in accordance with the present invention.

According to another aspect of the present invention, a method of delivering ion source gas to an ion implantation system is disclosed, as illustrated in FIG. 7 and designated at reference numeral 200. The method 200 comprises maintaining an ion source gas at a storage location at a first voltage potential 202 and then delivering the ion source gas to the ion source 204 which resides at a second voltage potential. For example, the ion source gas may be stored in the gas bunker 102 of FIG. 2 at a circuit ground potential and then delivered to the ion source of the ion implantation system which operates at a higher voltage (e.g., about 80 KV).

According to one exemplary aspect of the present invention, delivering the ion source gas (step 204) may be performed according to the flow chart of FIG. 8. The ion source gas is transferred from its storage location to the gas box associated with the ion implantation system for example, using the bulk gas delivery system 104 of FIG. 2, and coupled to a high voltage isolator structure (e.g., structure 108 of FIGS. 6a and 6b) at step 206. The high voltage isolator is coupled to the ion source of the implantation system which provides for the transfer of ion source gas therethrough to the ion implantation system at step 208. The high voltage isolator facilitates a step-up in potential of the ion source gas from the first potential to the second potential in a safe, reliable manner at a location generally local to the ion implantation system, for example, in the system gas box (e.g., gas box 106 of FIG. 2).

The ion gas source delivery may be monitored at step 210 to ensure that gas delivery does not continue under a leaky system condition. For example, the high voltage isolator may be configured in a manner similar to structure 108 of FIGS. 6a and 6b, wherein an outer tube containing an inert gas surrounds an inner tube. The inert gas in the outer tube is then maintained at a pressure which is higher than the pressure of the ion source in the inner tube. Consequently, if any leakage associated with the inner tube exists, the ion source gas will be contained therein. By monitoring a pressure of the inert gas in the outer tube, a leakage is detected if the pressure decreases, for example, if the pressure falls below a predetermined threshold.

If the pressure has fallen below the predetermined threshold, a determination is made that leakage associated with the isolator structure exists. The ion source gas transfer is then discontinued at step 212 based on the determination, for example, by closing transfer valves associated with the bulk gas delivery system 104 of FIG. 2.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A gas delivery system for an ion implantation, comprising:

a gas source at a first voltage potential;

an ion source at a second voltage potential which is larger than the first voltage potential; and an electrically insulative connector coupled between the gas source and the ion source, wherein the electrically insulative connector comprises a first electrically insulative tube and a second electrically insulative tube, wherein the second electrically insulative tube is in telescope arrangement with and surrounding the first electrically insulative tube, the telescope arrangement forming a spacing therebetween for facilitating a delivery of a pressurized gas within the spacing.

2. The system of claim 1, wherein the first voltage potential comprises a circuit ground potential.

3. The system of claim 1, wherein the gas source provides a pressurized gas.

4. The system of claim 1, wherein the electrically insulative connector comprises a borosilicate glass, an aluminosilicate glass, quartz, or a ceramic material.

5. The system of claim 1, wherein a pressure of a gas within the spacing is greater than a pressure of a gas within the first electrically insulative tube, thereby preventing a leakage of gas from the first electrically insulative tube into the spacing.

6. The system of claim 5, further comprising a pressure monitoring device coupled to a port associated with the second electrically insulative tube, wherein the pressure monitoring device is operable to detect a change in pressure within the spacing.

7. The system of claim 6, further comprising a safety controller associated with the pressure monitoring device, wherein the safety controller is adapted to decouple the gas source from the electrically insulative connector based on pressure information provided by the pressure monitoring device.

8. The system of claim 1, wherein a pressure of a gas within the spacing is different than a pressure of a gas within the first electrically insulative tube, and further comprising a monitoring device associated with the electrically insulative connector, wherein the monitoring device is operable to detect leakage associated with the electrically insulative connector.

9. A gas delivery system for an ion implantation, comprising:
   a gas source at a first voltage potential;
   an ion source at a second voltage potential which is larger than the first voltage potential; and
   an electrically insulative connector coupled between the gas source and the ion source, wherein the electrically insulative connector comprises a plurality of gas delivery high voltage isolators, wherein each of the isolators further comprise:
      an inner elongated tube adapted to transfer a source gas from the gas source to the ion source; and
      an outer elongated tube in generally telescope arrangement with the inner tube, wherein the telescope arrangement defines a spacing between the inner tube and the outer tube, respectively, and adapted to contain an inert protection gas within the spacing.

10. The system of claim 9, wherein each of the isolators are adapted to transfer a source gas which differs from the source gases in the other isolators, thereby facilitating an expeditious changeover of source gases at the ion source.

11. The system of claim 9, further comprising a first exhausted enclosure enclosing a first end of the isolators and coupled to the gas source, and a second exhausted enclosure at a second end of the isolators and coupled to the ion source, wherein the first exhausted enclosure is maintained at the first voltage potential and the second exhausted enclosure is maintained at the second voltage potential, respectively.

12. The system of claim 11, further comprising a valve arrangement associated with the first and second exhausted enclosures adapted to provide a purging of a source gas in a first direction toward the gas source in a first configuration, and provide a purging of the source gas in a second direction toward the ion source in a second configuration, respectively.

13. A method of delivering gas to an ion implantation system, comprising the steps of:
   maintaining a voltage potential of a source gas at a storage location at a first voltage potential that is less than a second voltage potential at an ion source of the ion implantation system; and
   delivering the source gas from the storage location to the ion source, wherein delivering the stored source gas further comprises the steps of:
      engaging a valve arrangement to permit the source gas to flow toward the ion source through a gas transfer system, wherein the gas transfer system is generally at the first voltage potential; and
      coupling the gas transfer system to the ion source through a high voltage isolator, wherein the high voltage isolator comprises a first electrically insulative tube and a second electrically insulative tube, wherein the first tube has a length which is sufficient to withstand a voltage thereacross, wherein the voltage is a difference between the first voltage potential and the second voltage potential, and wherein the second tube is in a generally telescope arrangement with and generally surrounds the first tube, the generally telescope arrangement defining a spacing therebetween.

14. The method of claim 13, wherein the stored source gas is pressurized.

15. The method of claim 13, wherein the first voltage potential is about circuit ground potential.

16. The method of claim 13, wherein the second voltage is about 80 KV.

17. The method of claim 13, wherein coupling the gas transfer system to the ion source through the high voltage isolator comprises:
   coupling a first end of the high voltage isolator to the gas transfer system, wherein the first end is at the first voltage potential; and
   coupling a second end of the high voltage isolator to the ion source, wherein the second end is at the second voltage potential.

18. The method of claim 13, wherein delivering the source gas from the storage location to the ion source comprises:
   transferring the source gas within the first tube at a first pressure; and
   transferring an inert gas within the spacing between the first and second tubes at a second pressure which is greater than the first pressure, thereby preventing the source gas from leaking into the spacing.

19. The method of claim 18, further comprising monitoring the second pressure of the inert gas within the spacing, wherein a leakage is detected if the second pressure falls below a predetermined threshold pressure.

20. A method of delivering gas to an ion implantation system, comprising the steps of:
   maintaining a voltage potential of a source gas at a storage location at a first voltage potential that is less than a second voltage potential at an ion source of the ion implantation system;
   delivering the source gas from the storage location to the ion source, wherein delivering the stored source gas further comprises the steps of:
      engaging a valve arrangement to permit the source gas to flow toward the ion source through a gas transfer system, wherein the gas transfer system is generally at the first voltage potential; and
      coupling the gas transfer system to the ion source through a high voltage isolator;
   the method further comprising the step of purging the high voltage isolator in a first direction, wherein the source gas is evacuated from the gas transfer system.

21. A method of delivering gas to an ion implantation system, comprising the steps of:
   maintaining a voltage potential of a source gas at a storage location at a first voltage potential that is less than a second voltage potential at an ion source of the ion implantation system;
   delivering the source gas from the storage location to the ion source, wherein delivering the stored source gas further comprises the steps of:
      engaging a valve arrangement to permit the source gas to flow toward the ion source through a gas transfer system, wherein the gas transfer system is generally at the first voltage potential; and
      coupling the gas transfer system to the ion source through a high voltage isolator;
   the method further comprising the step of purging the high voltage isolator in a second direction, wherein the source gas is evacuated from a region near the ion source.

* * * * *